(12) United States Patent
Takeya et al.

(10) Patent No.: US 8,921,152 B2
(45) Date of Patent: Dec. 30, 2014

(54) METHOD FOR MANUFACTURING ORGANIC SEMICONDUCTOR FILM, AND ORGANIC SEMICONDUCTOR FILM ARRAY

(75) Inventors: Junichi Takeya, Osaka (JP); Takafumi Uemura, Osaka (JP)

(73) Assignee: Osaka University, Osaka (JP)

( * ) Notice: Subject to any disclaimer, the term of this patent is extended or adjusted under 35 U.S.C. 154(b) by 120 days.

(21) Appl. No.: 13/499,743

(22) PCT Filed: Aug. 26, 2010

(86) PCT No.: PCT/JP2010/064488
§ 371 (c)(1),
(2), (4) Date: Apr. 2, 2012

(87) PCT Pub. No.: WO2011/040155
PCT Pub. Date: Apr. 7, 2011

(65) Prior Publication Data
US 2012/0193618 A1  Aug. 2, 2012

(30) Foreign Application Priority Data

Oct. 2, 2009  (JP) ................................. 2009-230451

(51) Int. Cl.
*C09D 11/30* (2014.01)
*H01L 51/00* (2006.01)

(52) U.S. Cl.
CPC ......... *H01L 51/0004* (2013.01); *H01L 51/0071* (2013.01); *H01L 51/0074* (2013.01)
USPC .......................... 438/99; 257/40; 257/E51.028

(58) Field of Classification Search
CPC ......... H01L 51/40; H01L 51/00; H01L 33/00; H01L 21/00; H01L 51/0004; H01L 51/0074; H01L 51/0071; H01L 51/0005; H01L 51/0545; H01L 51/0025; H01L 27/3295; H01L 51/56; H01L 51/0059; G02F 2201/42; G01F 1/1345; C09D 11/30
USPC ................ 427/66, 162, 421, 421.4, 424, 425, 427/427.3; 257/40, E21.46, E51.006, 779, 257/E21.412; 438/99, 82
See application file for complete search history.

(56) References Cited

U.S. PATENT DOCUMENTS 6,842,657 B1 *  1/2005  Drzaic et al. .................. 700/120
2001/0005247 A1 *  6/2001  Kikkawa ....................... 349/117

(Continued)

FOREIGN PATENT DOCUMENTS

JP  03-059036  3/1991
JP  02003-059036  3/1991

(Continued)

*Primary Examiner* — David Vu
*Assistant Examiner* — Mouloucoulaye Inoussa
(74) *Attorney, Agent, or Firm* — Hamre, Schumann, Mueller & Larson, P.C.

(57) ABSTRACT

A raw material solution containing an organic semiconductor material and a solvent is supplied onto a substrate 1 and dried, forming an organic semiconductor film 4. A contact member 7 is used, which is provided with multiple contact faces 6a for contacting the raw material solution. The contact member is positioned such that the contact faces have a certain relationship with the surface of the substrate, and multiple droplets 3 of the raw material solution is formed on the substrate, thereby establishing a droplet-retaining state, in which the contact faces retain the respective droplets. The solvent is evaporated to form organic semiconductor films at the locations on the surface of the substrate that correspond to the multiple contact faces. The method can be performed with simple solution processes and can produce organic semiconductor films of high charge mobility.

7 Claims, 12 Drawing Sheets

(56) References Cited

U.S. PATENT DOCUMENTS

| | | | |
|---|---|---|---|
| 2005/0001210 A1* | 1/2005 | Lee et al. | 257/40 |
| 2006/0045959 A1* | 3/2006 | Yasukawa et al. | 427/66 |
| 2006/0051498 A1* | 3/2006 | Katagami et al. | 427/66 |
| 2007/0252229 A1 | 11/2007 | Fujimori et al. | |
| 2008/0012005 A1* | 1/2008 | Yang et al. | 257/40 |
| 2008/0063949 A1* | 3/2008 | Inoue | 430/5 |
| 2009/0194763 A1 | 8/2009 | Mino et al. | |
| 2009/0256157 A1* | 10/2009 | Kondo et al. | 257/72 |
| 2010/0323473 A1* | 12/2010 | Yamada et al. | 438/99 |

FOREIGN PATENT DOCUMENTS

| | | |
|---|---|---|
| JP | 2007-294704 | 11/2007 |
| JP | 2008-227141 | 9/2008 |
| WO | WO2007/142238 | 12/2007 |

* cited by examiner

METHOD FOR MANUFACTURING ORGANIC SEMICONDUCTOR FILM, AND ORGANIC SEMICONDUCTOR FILM ARRAY

TECHNICAL FIELD

The present invention relates to a method for manufacturing an organic semiconductor film by a solution process using an organic semiconductor material, and also relates to an organic semiconductor film array configured by arranging multiple regions of the organic semiconductor film.

BACKGROUND ART

In recent years, it has become apparent that organic semiconductor materials possess superior electrical properties in comparison with inorganic semiconductor materials, and progress has been made in the development of applications to various electronic device fields. An organic thin film transistor (TFT), which utilizes an organic semiconductor film in a semiconductor channel, is easier to process than an inorganic semiconductor and permit application of simple and inexpensive manufacturing processes. In addition, by permitting fabrication in the vicinity of room temperature, they enable semiconductor technologies based on the use of plastic substrates and are expected to be used as post-silicon semiconductors.

Depending on the characteristics of the materials, various methods, such as vapor deposition processes, molecular beam epitaxy solvent evaporation processes, melt processes, the Langmuir-Blodgett process, and the like, heretofore have been investigated as methods for fabricating a crystalline organic semiconductor thin film for use in organic TFT.

An example of an improved method, in which an organic single crystal film is fabricated by a solvent evaporation process, is disclosed in Patent Document 1. This method is an improvement over the conventional method, in which multiple substrates of quartz and the like were stacked, and organic single crystal films were grown between these substrates with the help of a solvent evaporation process. Specifically, it changes the approach, in which substrates are placed in a vessel containing a solution of an organic substance horizontally with respect to the surface of the solution, and involves conducting the solvent evaporation process while keeping the substrates inclined with respect to the surface of the solution. This is aimed at accelerating the process of solvent evaporation up to the range required for crystal growth between the substrates in order to improve seed crystal generation and the efficiency of the growth process.

Among the methods based on the principle of solvent evaporation, solution processes utilizing solutions, such as droplet formation, spin-coating, and printing, are the most desirable methods for the development of high-performance organic TFTs due to their simplicity and the fact that they are inexpensive and permit fabrication in the vicinity of room temperature. The solution process is a method in which dripping or applying an organic semiconductor material solution to the surface of a substrate and drying the solvent contained in the droplets brings the solution into a saturated state via solvent evaporation and causes crystals to precipitate, thereby forming an organic semiconductor thin film.

CITATION LIST

Patent Documents

[Patent Document 1] JP 03-59036A

SUMMARY OF THE INVENTION

Problems to be Solved by the Invention

Since the technology disclosed in Patent Document 1 is applied to a method of fabricating an organic single crystal film used for optical devices, it is not intended to obtain electrical properties required for organic semiconductors. For this reason, even when the method disclosed in Patent Document 1 is used, it is difficult to fabricate an organic semiconductor film possessing electrical properties, in particular, sufficient charge mobility, that would be satisfactory for organic semiconductor films used in organic TFTs.

In addition, while there have been reports of various technologies, in which materials ranging from low molecular weight to high molecular weight are utilized in the fabrication of organic semiconductor films possessing sufficient charge mobility based on solution processes, the organic semiconductor films obtained by such solution processes, as well as the performance of the organic TFTs in which they are used, are still insufficient for replacing amorphous silicon TFTs on an industrial scale. In other words, it has been difficult to obtain organic semiconductor films of sufficient mobility by a solution process, simply by drying the solvent.

Therefore, it is an object of the present invention to provide a method for manufacturing an organic semiconductor film that is implemented using a simple procedure based on a solution process and, furthermore, permits fabrication of an organic semiconductor film of high charge mobility.

Another object is to provide an organic semiconductor film array obtained using such a method for manufacturing an organic semiconductor film and having arranged therein multiple organic semiconductor film regions.

Means for Solving the Problems

The method for manufacturing an organic semiconductor film according to the present invention includes supplying a raw material solution containing an organic semiconductor material and a solvent onto a substrate and drying the raw material solution, thereby forming an organic semiconductor film on the substrate.

To address the above-mentioned problems, the manufacturing method of the present invention includes: using a contact member provided with a plurality of contact faces for contacting the raw material solution; positioning the contact member such that the contact faces have a certain relationship with the surface of the substrate, and forming a plurality of droplets of the raw material solution on the substrate, thereby establishing a droplet-retaining state, in which the plurality of contact faces retain the respective droplets; and evaporating the solvent in the droplets, so as to form the organic semiconductor films at the locations on the surface of the substrate that correspond to the plurality of contact faces.

The organic semiconductor film array of the present invention includes: a substrate; and organic semiconductor films arranged in a mutually separated manner in a plurality of regions on the surface of the substrate, wherein the organic semiconductor Elms are formed by the method as defined above.

Effects of the Invention

In accordance with the method for manufacturing an organic semiconductor film of the above-described configuration, the direction of growth of the organic semiconductor film regions during the evaporation process is defined by the effect obtained by contact with the contact faces in a state in which droplets of the raw material solution are adhered to the contact faces. As a result, molecular ordering the organic semiconductor film is improved, thereby making it possible to obtain an organic semiconductor film possessing high mobility with the use of simple solution processes. Furthermore, it permits the ready fabrication of an organic semiconductor film array containing multiple regions of organic semiconductor films that are mutually separated in multiple regions on the surface of the substrate and are formed in correspondence to the position of the contact member.

Due to the configuration of the thus configured organic semiconductor film array, it can be manufactured easily, while having an organic semiconductor film possessing high mobility.

DESCRIPTION OF THE INVENTION

The method for manufacturing an organic semiconductor film of the present invention can be modified based on the above-described configuration as described in the following.

Namely, it is possible to employ a modification such that the contact member is composed of an auxiliary substrate and a plurality of contact protrusions formed on the auxiliary substrate, and each of the contact faces is configured with a portion of the end faces of the contact protrusions that intersect the surface of the auxiliary substrate; and when the droplet-retaining state is established, the contact member is arranged such that the contact protrusions abut the surface of the substrate from above.

This configuration can be modified in a manlier such that the substrate is kept inclined at a certain angle, and the contact member is placed on the substrate such that the end faces configuring the contact faces are transverse to the direction of tilt of the substrate.

Further, it is possible to employ another modification such that the contact member is composed of an auxiliary substrate and a plurality of contact protrusions formed on the auxiliary substrate, and the end faces of the contact protrusions configure the contact faces, and when the droplet-retaining state is established, the contact member is arranged such that the contact faces of the plurality of contact protrusions confront the surface of the substrate with at least a partial gap provided therebetween, and the droplets of the raw material solution are retained between the surface of the substrate and the plurality of contact faces.

This configuration can be modified in a manner such that each of the plurality of contact faces has an inclined portion that is inclined with respect to the surface of the auxiliary substrate.

This configuration is further modified in a manner such that when the droplet-retaining state is established, the contact member is arranged such that a portion of the contact faces abuts the surface of the substrate.

Further, it is possible to employ another modification such that after supplying the raw material solution in order to form the droplets, the droplet-retaining state is established by keeping the auxiliary substrate and the substrate inclined at a predetermined angle.

Further, the organic semiconductor material can be formed of any material selected from [1]benzothieno[3,2-b]benzothiophene derivatives, 2,9-Dialkyldinaphtho[2,3-b:2',3'-f]thieno[3,2-b]thiophene derivatives, dinaphth[2,3-b:2,3-f]thiopheno[3,2-b]thiophene derivatives, TIPS-pentacene, TES-ADT, and its derivatives, perylene derivatives, TCNQ, F4-TCNQ, rubrene, pentacene, p3HT, pBTTT, and pDA2T-C16.

In the organic semiconductor film array of the above-described configuration, the charge mobility of the organic semiconductor film is preferably 3.5 cm$^2$/Vs or higher.

Embodiments of the present invention will be described below with reference to drawings.

Embodiment 1

A. Basic Procedure of Embodiment 1

Figure 1A:
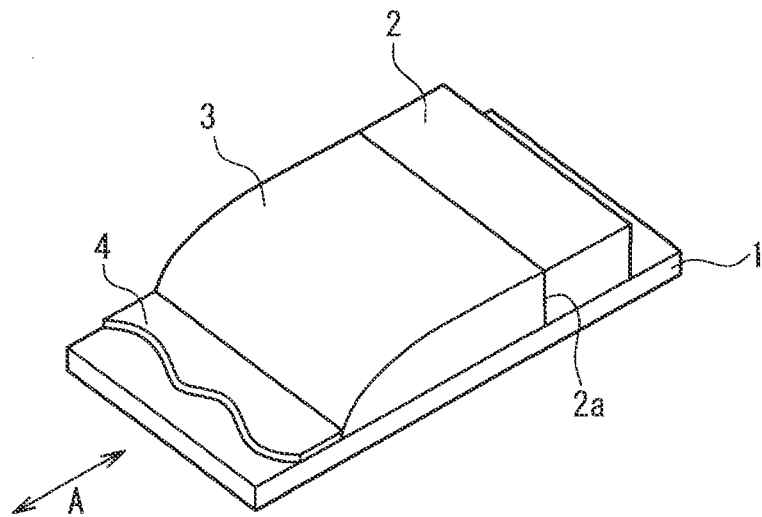
FIG. 1A is a perspective view illustrating steps of a method for manufacturing an organic semiconductor film according to Embodiment 1 of the present invention.

Next, the basic procedure of the method for manufacturing an organic semiconductor film according to Embodiment 1 of the present invention will be described with reference to FIG. 1A, 1B, and FIG. 2A. This manufacturing method, which is based on a solution process, utilizes a substrate 1 and an edge contact member 2. Namely, as shown in FIG. 1A, a droplet 3 is formed by supplying a raw material solution containing an organic semiconductor material and a solvent onto a substrate 1 so as to contact the edge contact member 2. An organic semiconductor film 4 is formed on the substrate 1 by drying the droplet 3 in this state.

The edge contact member 2 includes a contact face 2a as a portion of art end face, which intersects the surface of the substrate 1 when placed thereon. The planar shape of the contact face, i.e. its shape as seen from above the substrate 1, is rectilinear or curved. The droplet 3 is supplied so as to contact the contact face 2a of the edge contact member 2. While the edge contact member 2 can be formed, for instance, from resin and the like, any materials other than resin may be used as long as they adequately perform the functions described below.

As shown in FIG. 1A, the procedure for manufacturing an organic semiconductor film starts with placing the edge contact member 2 on the substrate 1 such that the contact face 2a is transverse to a predetermined direction A of the substrate 1, and, preferably, such that the contact face 2a is orthogonal to the direction A. In this state, a raw material solution is supplied onto the surface of the substrate 1 so as to contact the contact face 2a. Retained by the contact face 2a, the droplet 3 of the supplied raw material solution is subject to a constant force. Its cross-sectional shape in this state is illustrated in FIG. 2A.

The solvent contained in the droplet 3 is evaporated by carrying out a drying process while the droplet 3 is retained by the contact face 2a. As shown in FIG. 2A, this brings the raw material solution in the droplet 3 into a saturated state and causes crystals of the organic semiconductor material to start precipitating as a result of successive solvent evaporation in the edge portion remote from the contact face 2a in the direction A. The movement of the remote edge of the droplet 3 that accompanies the evaporation of the solvent is indicated by the dashed lines e1 and e2. As the solvent evaporates, crystallization of the organic semiconductor material proceeds and an organic semiconductor film 4 grows as illustrated in FIG. 1B. In other words, crystal growth proceeds and an organic semiconductor film 4 is formed gradually in the direction A of the substrate 1, towards the contact face 2a.

During this drying process, an effect of defining a crystal growth direction is exerted through contact with the contact face 2a while the droplet 3 of the raw material solution is adhered to the contact face 2a. This is believed to produce a crystallinity-controlling effect, so as to improve molecular ordering in the organic semiconductor material, contributing to an improvement in electron conductivity (mobility). It should be noted that, albeit in a polycrystalline state, the resultant organic semiconductor film 4 has good crystallinity and exhibits sufficiently good semiconductor properties.

Figure 2A:
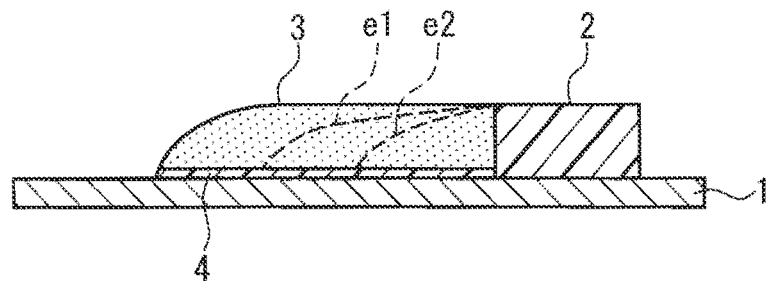
FIG. 2A is a cross-sectional view illustrating the steps of the same manufacturing method.
Figure 2B:
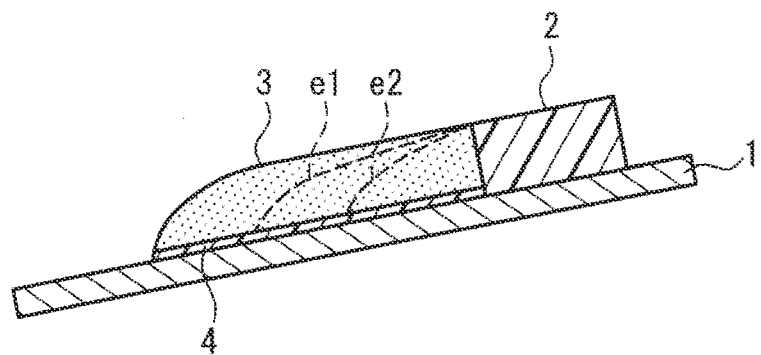
FIG. 2B is a cross-sectional view illustrating a variation of the steps of the same manufacturing method.

As a variation of the manufacturing method above, as shown in FIG. 2B, the substrate 1 is kept inclined at a certain angle to the direction A and the edge contact member 2 is placed on the substrate 1 such that the contact face 2a is transverse to the direction of tilt of the substrate 1, and, preferably, such that the contact face 2a is orthogonal to the direction of tilt. In this state, a raw material solution is supplied onto the surface of the substrate 1 so as to contact the contact face 2a. Retained by the contact face 2a, the droplet 3 of the supplied raw material solution is suspended in the direction of tilt of the substrate 1. The size of the surface wetted by the droplet 3 is controlled by tilting the substrate 1, which makes it easier to obtain an organic semiconductor film of the desired characteristics.

It should be noted that the methods of forming the droplet 3 are not limited to the method described above. For example, a droplet, adhering to the contact face 2a can be formed by a method such that the substrate 1 with the edge contact member 2 is immersed into a raw material solution and then taken out therefrom.

In order to investigate the effects of the method of the present embodiment, experiments were conducted, in which $C_8$-BTBT, a derivative of [1]benzothieno[3,2-b]benzothiophene (BTBT), was used as the organic semiconductor material. A 0.4-wt % solution of $C_8$-BTBT was prepared as the raw material solution using heptane as a solvent. The substrate 1 used for the experiment was prepared by forming a $SiO_2$ layer on a doped Si layer. A silicon wafer piece was used as the edge contact member 2.

Figure 3:
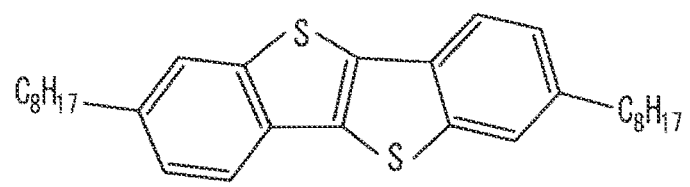
FIG. 3 is a diagram illustrating the molecular structure of $C_8$-BTBT as an example of the organic semiconductor material used in the same manufacturing method.

The BTBT derivative exhibits superior TFT performance with vacuum vapor deposition as well as with spin-coating. Its molecule contains alkyl chains attached to a BTBT backbone structure (see FIG. 3). The alkyl chains enhance the force of cohesion between adjacent molecules as a result of attractive interaction between the chains, which is referred to as the molecular fastener effect. According to crystal structure analysis, this results in effects that shorten intermolecular distances and reduce distances in the π-backbone responsible for election conduction, and thus becomes a factor that increases mobility even more. On the other hand, polycrystals are formed readily because the attractive interaction produces the effect of accelerating crystal growth.

First, after subjecting the substrate 1 to surface treatment by vacuum vapor deposition of decyltriethoxysilane (DTS), a droplet 3 of the raw material solution was formed on a tilted substrate 1 and retained by a contact face 2a of an edge contact, member 2. As the solvent evaporated, the crystalline region grew in the direction of tilt. After growing the crystalline film, the edge contact member 2 was removed and drying was carried out for 5 hours at 50° C. under vacuum in order to remove the solvent completely.

Figure 4A:
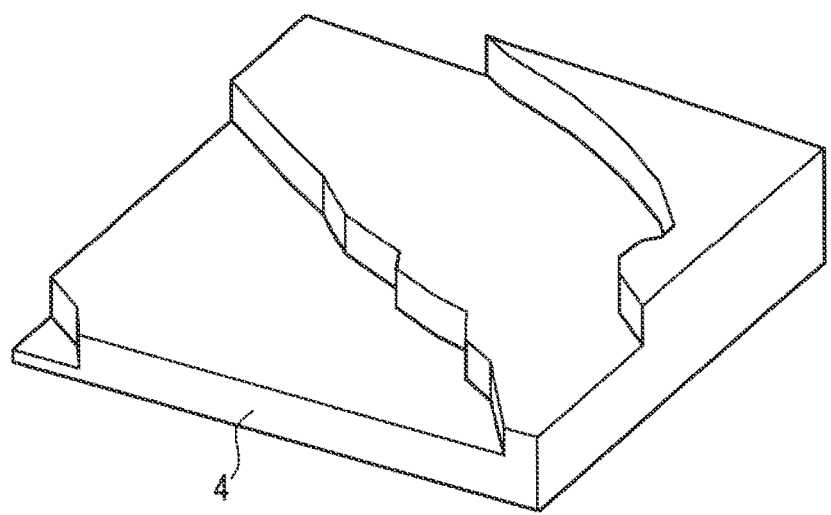
FIG. 4A is a perspective view illustrating the state of the organic semiconductor film fabricated by the same manufacturing method.
Figure 4B:
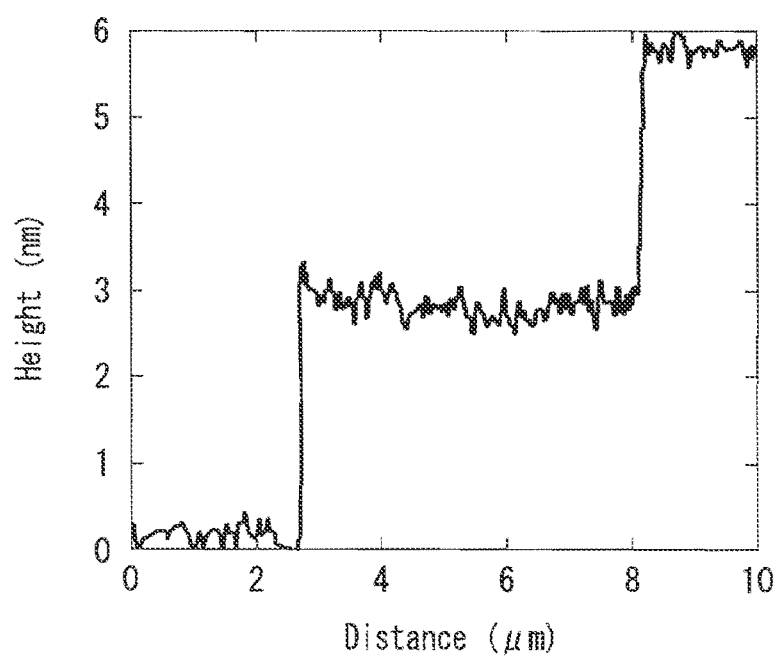
FIG. 4B is a diagram showing a cross sectional profile of the same organic semiconductor film.

FIG. 4A illustrates the surface morphology of the $C_8$-BTBT film formed in the above-described manner as observed by atomic force microscopy. A cross sectional profile is illustrated in FIG. 4B. The profile is flat at the molecular level throughout a micrometer-scale step region, and the level difference corresponds to a monomolecular layer with a height equal to that of a $C_8$-BTBT molecule. The steps and step structure are typical and similar to those of representative organic single crystals such as rubrene and pentacene. The excellent flatness and clearly defined molecular steps indicate that a highly oriented crystalline film grows on the $SiO_2$ dielectric surface of the substrate 1.

Next, source and drain electrodes were formed by vapor deposition such that the channel was oriented parallel to the direction A, that is, the direction of crystal growth, of the organic semiconductor film of $C_8$-BTBT formed in the above-described manner. The length and width of the channel were respectively 0.1 mm and 1.5 mm. A doped Si layer in the substrate 1 was used as a gate electrode and an electric field was applied to the 500-nm thick $SiO_2$ (dielectric constant: approximately 3.9).

Figure 5A:
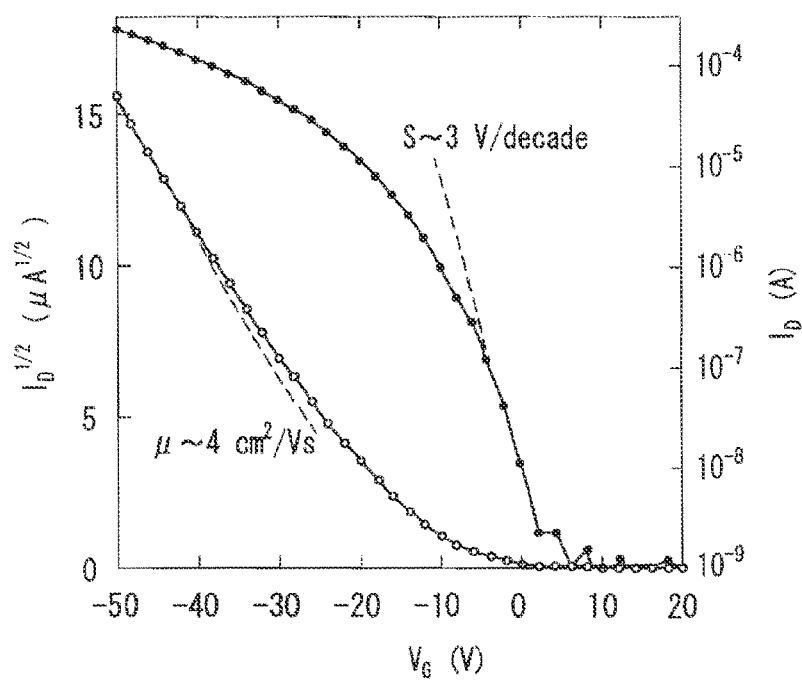
FIG. 5A is a diagram illustrating the transfer characteristics of a field-effect transistor fabricated using the same organic semiconductor film.

The transfer characteristics in the saturated region of the TFT thus fabricated and operated are illustrated in FIG. 5A. In FIG. 5A, the horizontal axis represents gate voltage (V), the vertical axis on the left-hand side represents a square root of the absolute value of drain current, and the vertical axis on the right-hand side represents drain current (A) on a logarithmic scale. The measured values indicated by the open circles represent square roots of the absolute value of drain current and the filled circles represent drain current (A).

The gradient of the plot of FIG. 5A indicates a mobility of about 5 $cm^2$/Vs. The sub-threshold characteristic is excellent, 3 V/decade. Most of the good devices fabricated by the same method exhibited values in the range of 3.5 $cm^2$/Vs to 5 $cm^2$/Vs. On the other hand, for devices that had obvious crystal defects observable by light microscopy, the value was 2 $cm^2$/Vs. The yield can be improved if the dimensions of the devices are reduced and the drying of the semiconductor film is carried out more slowly. The on-off was generally in excess of $10^6$ for all the fabricated devices.

Figure 5B:
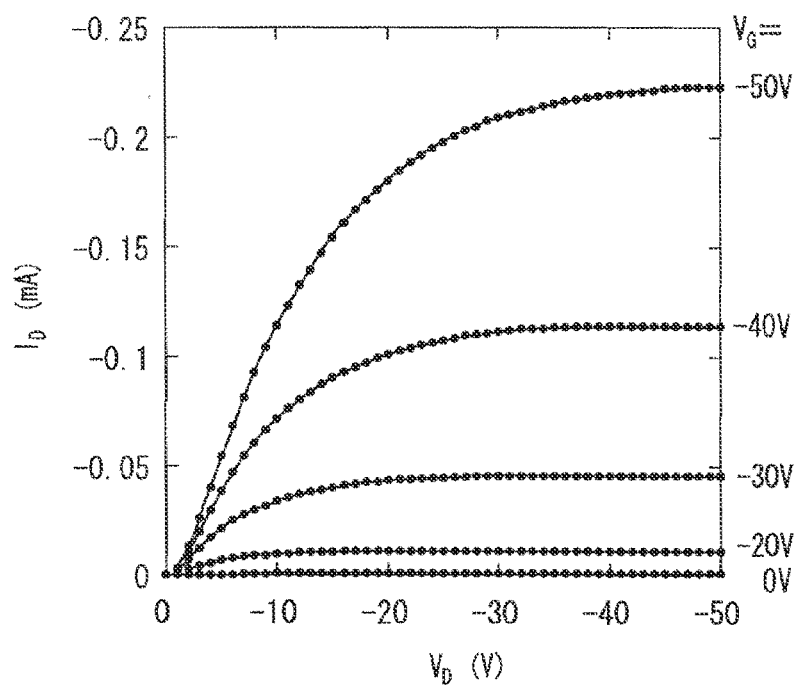
FIG. 5B is a diagram illustrating the output characteristics of the same field-effect transistor.

FIG. 5B illustrates the output characteristics of the fabricated devices described above. Various cases involving gate voltages of $V_G$=0, −20, −30, −40, and −50V are illustrated.

While the highest mobility that has been obtained with $C_{13}$-BTBT films using conventional solution processes is 2.3 $cm^2$/Vs, reproducibility is low. A high mobility of 1.8 $cm^2$/Vs has been implemented by conventional solution processes using $C_8$-BTBT, as is done in the present embodiment. In contrast, in this embodiment, as described above, a high mobility of 5 $cm^2$/Vs is obtained with excellent reproducibility. This mobility value is five times higher than the mobility of a typical amorphous silicon TFT, i.e. approximately 1 $cm^2$/Vs, and demonstrates the superiority of the organic TFTs of the present embodiment.

As described above, in accordance with this embodiment, a crystalline film of excellent orientation can be grown and an organic semiconductor film that permits high mobility to be obtained can be fabricated using an easy manufacturing method based on a solution process. Accordingly, it may become a basic technology for simply and inexpensively mass producing high-performance organic transistors.

The material, of the substrate 1 is not limited to above-described materials, in which a $SiO_2$ layer is formed on a doped Si layer, and materials obtained by coating an electrically conductive metal surface of copper, aluminum, etc. with a high molecular weight insulating film of parylene, polyvinyl phenol, and the like can also be used. Further, in addition to silicon wafers, any material may be used for the edge contact member 2 so long as it is adequate for the above-described functionality.

Further, it is preferable to adjust the angle of tilt of the substrate 1, the rate of the drying process, the solvent, and the like as appropriate depending on the organic semiconductor material and the properties, shape, and the like of the organic semiconductor film to be fabricated.

B. Procedure for Manufacturing Organic Semiconductor Film Array

A method for manufacturing an organic semiconductor film array, which is based on the steps described above and is of high practical value in the fabrication of organic thin film transistors (TFT), will be described next with reference to FIGS. 6A-6C.

Essentially, the feature of the method for manufacturing an organic semiconductor film array of the present invention consists in establishing a droplet-retaining state on the substrate with the help of a contact member having arranged therein multiple contact faces, to which a raw material solution is adhered. The droplet-retaining state is a state, in which the contact member is arranged such that the contact faces are in a fixed relationship with respect to the surface of the substrate, multiple droplets of the raw material solution are formed on the substrate, and these droplets are retained by the multiple contact faces. In this state, evaporation of the solvent in the droplets causes an organic semiconductor film to be formed at the locations on the surface of the substrate that correspond to the multiple contact faces. The thus defined feature is common to the methods for manufacturing an organic semiconductor film array used in all the embodiments of the present invention.

Figure 1B:
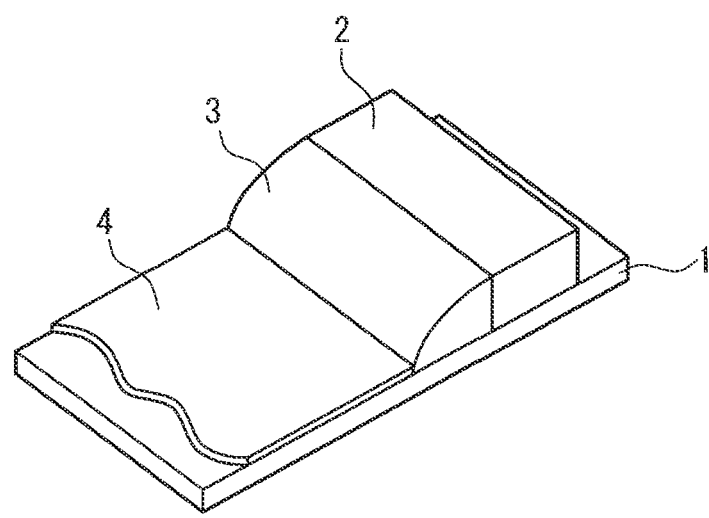
FIG. 1B is a perspective view illustrating a step that is subsequent to FIG. 1A in the same manufacturing method.
Figure 6A:
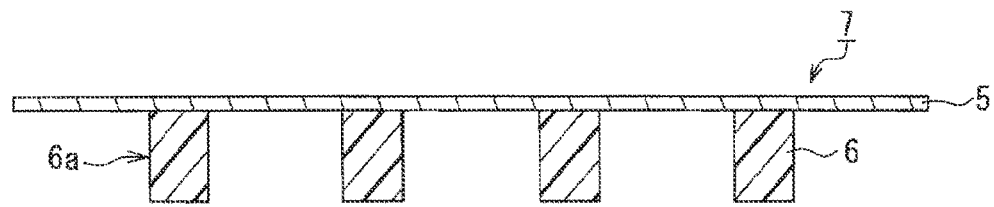
FIG. 6A is a cross-sectional view illustrating the steps of the method for manufacturing an organic semiconductor film array according to Embodiment 1.
Figure 6B:
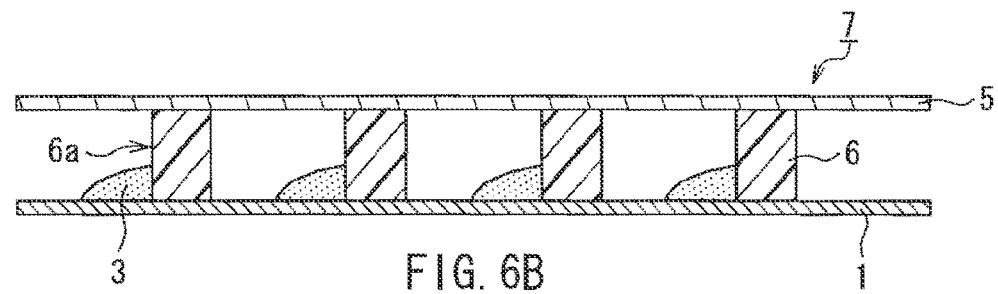
FIG. 6B is a cross-sectional view illustrating a step that is subsequent to FIG. 6A in the same manufacturing method.
Figure 6C:
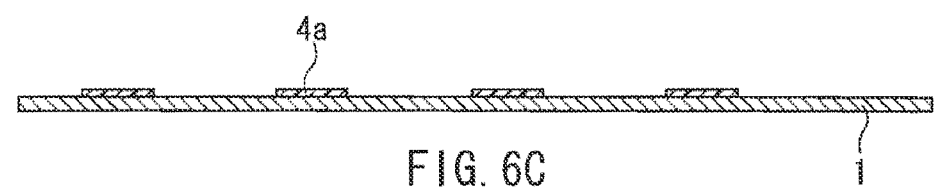
FIG. 6C is a cross-sectional view illustrating a step that is subsequent to FIG. 6B in the same manufacturing method.

The manufacturing procedure illustrated in FIGS. 6A-6C is an example of a method for manufacturing an organic semiconductor film array that corresponds to the embodiment illustrated in FIGS. 1A and 1B. Therefore, as shown in FIG. 6A, this method employs a contact member 7 configured to have multiple contact protrusions 6 arranged on an auxiliary substrate 5. The contact protrusions 6 perform functions similar to the edge contact member 2 illustrated in FIG. 1A. Namely, contact faces 6a are constituted by a portion of the side faces of the contact protrusions 6 that intersect the surface of the auxiliary substrate 5.

Since the procedure for manufacturing an organic semiconductor film starts with establishing a droplet-retaining state, as shown in FIG. 6A, the contact member 7 is arranged above the substrate 1 such that the contact protrusions 6 and the substrate 1 are opposed and then, as shown in FIG. 6B, the contact protrusions 6 abut the substrate 1. In this state, droplets 3 are formed by supplying a raw material solution so as to contact each of the contact faces 6a. The droplets 3 of the raw material solution are retained by the contact surfaces 6a.

It should be noted that in this embodiment, the method of forming droplets 3 is not limited to the method described above, and, for example, the substrate 1, along with the contact member 7 can be immersed in the raw material solution and then removed from it, thereby causing the contact faces 6a to retain the droplets 3.

When the solvent contained in the droplets 3 is evaporated by carrying out a drying press in this state, in the same manner as before, as shown in FIG. 6C, the evaporation of the solvent from the droplets 3 will cause crystals of the organic semiconductor material to grow and an organic semiconductor films 4a to be formed at the locations on the surface of the substrate 1 that correspond to the multiple contact faces 6a. By doing so, it is possible to fabricate an organic semiconductor film array having organic semiconductor films 4a arranged therein in a mutually separated manner in multiple regions on the surface of the substrate 1. As before, the multiple organic semiconductor films 4a exhibit high mobility.

C. Variations of Present Embodiment

Figure 7:
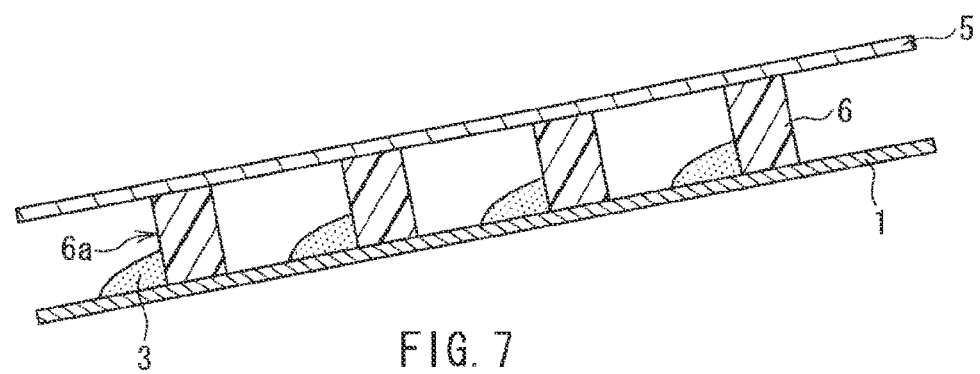
FIG. 7 is a cross-sectional view illustrating a variation of the steps of the same manufacturing method.

It should be noted that, just like in the embodiment illustrated in FIG. 2B, a method can be used, in which the substrate 1 is kept inclined at a predetermined angle as shown in FIG. 7. The contact member 7 is placed on the substrate 1 such that the contact flees 6a are transverse to the direction of tilt of the substrate 1, and, preferably, such that the contact faces 6a are orthogonal to the direction of tilt. In this state, droplets 3 of the raw material solution are formed and a drying step is carried out.

Embodiment 2

A. Basic Procedure of Embodiment 2

Next, the basic procedure of the method for manufacturing an organic semiconductor film according to Embodiment 2 of the present invention will be described with reference to FIG. 8A, 8B, and FIG. 9. In this manufacturing method, the surface of a planar contact member 8 facing a substrate 1 constitutes a contact face 8a. The planar contact member 8 is arranged such that the contact face 8a is inclined with respect to the substrate 1. Consequently, a wedge-shaped gap is provided between the contact face 8a and the surface of the substrate 1 and, when a droplet-retaining state is established, a droplet 3 of the raw material solution is retained between the surface of the substrate 1 and the contact face 8a.

In the same manner as the edge contact member 2 of Embodiment 1, the planar contact member 8 can be formed, for instance, from resin and the like. However, any materials other than resin may be used as long as they adequately perform the functions described below. In addition, as described below, it is not essential for the contact face 8a to be inclined.

Figure 8A:
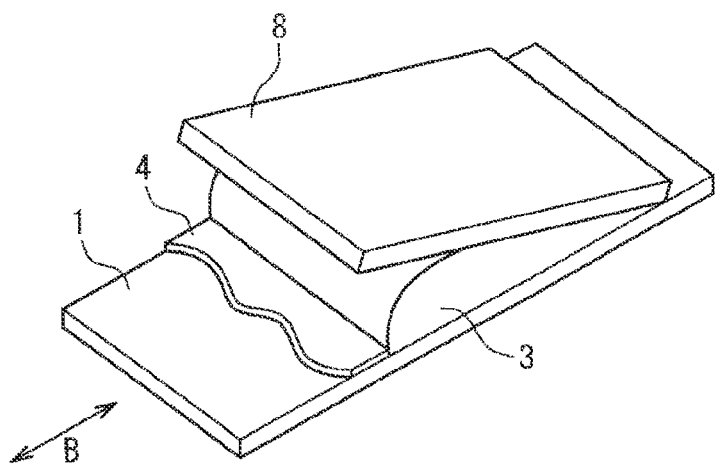
FIG. 8A is a perspective view illustrating the steps of the method for manufacturing an organic semiconductor film according to Embodiment 2 of the present invention.
Figure 8B:
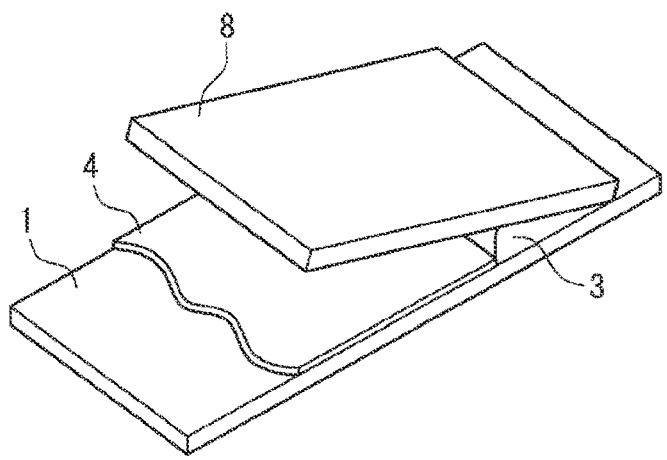
FIG. 8B is a perspective view illustrating a step that is subsequent to FIG. 8A in the same manufacturing method.
Figure 9:
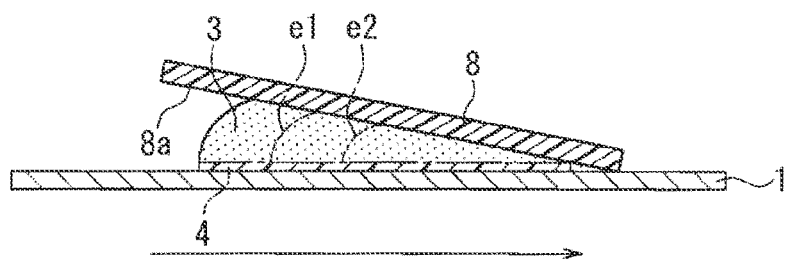
FIG. 9 is a cross-sectional view illustrating the steps of the same manufacturing method.

As shown in FIG. 8A, the manufacturing procedure starts with placing the planar contact member 8 on the substrate 1 such that the direction of tilt of the contact face 8a is oriented in a predetermined direction B of the substrate 1. In this state, a raw material solution is supplied so as to contact the contact face 8a and is caused to spread into the gap between the contact face 8a and the surface of the substrate 1 by capillary forces. Retained by the contact face 8a, the resultant droplet 3 of the supplied raw material solution is subject to a constant force. Its cross-sectional shape in this state is illustrated in FIG. 9.

The solvent contained in the droplet 3 is evaporated by carrying out a drying process while the droplet 3 is retained by the contact face 8a. As shown in FIG. 8A, this brings the raw material solution in the droplet 3 into a saturated state and causes crystals of the organic semiconductor material to start precipitating as a result of successive solvent evaporation in the edge portion on the open side of the contact face 8a in the direction B of the substrate 1. The movement of the edge on the open side of the droplet 3 that accompanies the evaporation of the solvent is indicated by the dashed lines e1 and e2. As the solvent evaporates, crystallization of the organic semiconductor material proceeds and an organic semiconductor film 4 grows as illustrated in FIG. 8B. In other words, crystal growth proceeds and an organic semiconductor film 4 is gradually formed in the direction B of the substrate 1, towards the closed side of the contact face 8a.

In the same manner as in Embodiment 1, during this drying process, a crystal growth direction-defining action is exerted through contact with the contact face 8a while the droplet 3 of the raw material solution is adhered to the contact face 8a. This is believed to produce a crystallinity-controlling effect, so as to improve molecular ordering in the organic semiconductor material, and contribute to an improvement in electron conductivity (mobility).

It should be noted that the methods of forming the droplet 3 are not limited to the method described above. For example, a droplet adhered to the contact face 8a can be formed by immersing the substrate 1 with the planar contact member 8 into a raw material solution and then taken out therefrom.

The method for manufacturing an organic semiconductor film of the present embodiment is suitable, for example, for forming crystalline films of materials that are poorly soluble in organic solvents, for example, such as 2,9-Dialkyldinaphtho[2,3-b:2',3'-f]thieno[3,2-b]thiophenes (Cn-DNTT), and the like. Such materials often have been fabricated by vapor phase epitaxy, and there have been no known examples of high-mobility films formed by solution processes. In contrast, the manufacturing method of the present embodiment has made it possible to deposit $C_{10}$-DNTT and form an organic semiconductor film possessing a high mobility characteristic, i.e. exhibiting a mobility of 6 cm$^2$/Vs.

During film deposition, the substrate 1 was maintained at approximately 120° C., $C_{10}$-DNTT was dissolved in o-dichlorobenzene heated to 120° C. and spread into the gap between the contact face 8a and the surface of the substrate 1. In accordance with this method, a coating film of high crystallinity and uniform orientation is obtained because the raw material solution is securely retained in the gap and the direction of drying of the solution is fixed.

Source and drain electrodes were formed by vapor deposition such that the channel was oriented parallel to the direction B, i.e. the direction of crystal growth, of the organic semiconductor film of $C_{10}$-BTBT formed in the above-described manner. The length and width of the channel were respectively 0.1 mm and 1.5 mm. An electric field was applied to the 500-nm thick $SiO_2$ (dielectric constant: approximately 3.9) using a doped Si layer in the substrate 1 as a gate electrode.

Figure 10A:
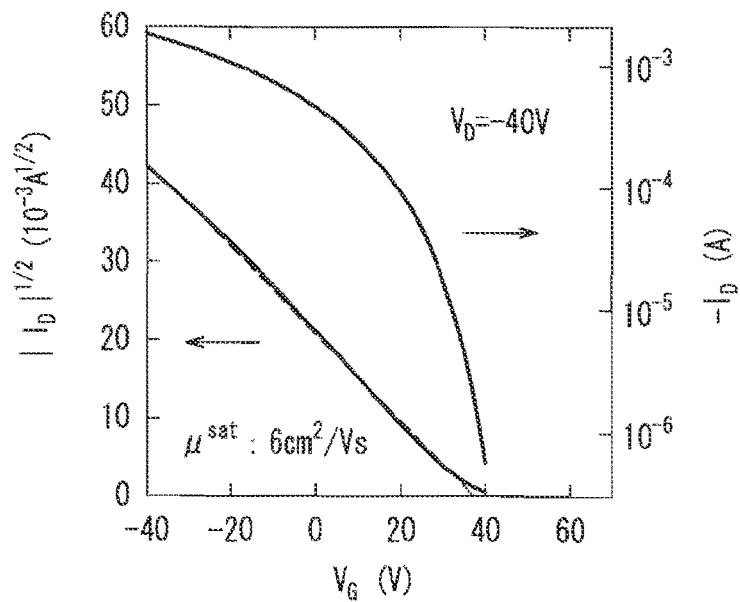
FIG. 10A is a diagram illustrating the transfer characteristics of a field-effect transistor fabricated using the same organic semiconductor film.
Figure 10B:
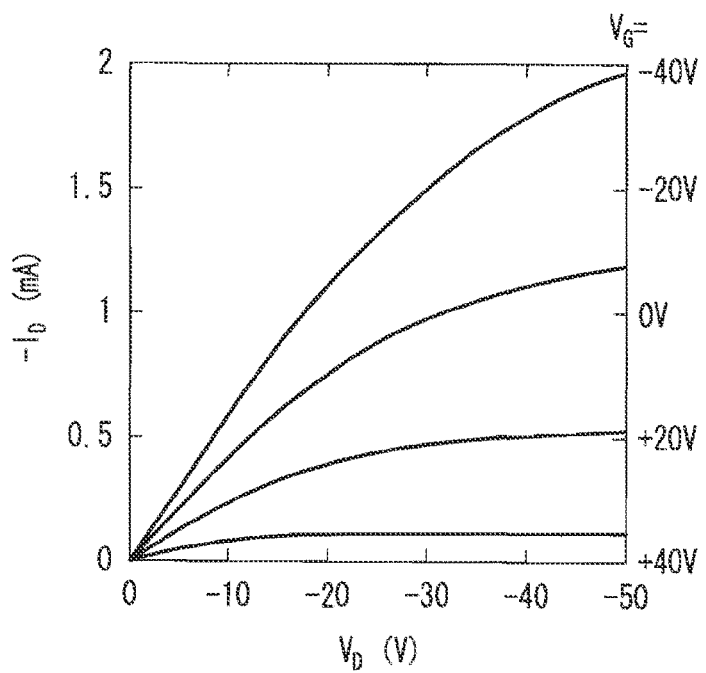
FIG. 10B is a diagram illustrating the output characteristics of a field-effect transistor fabricated using the same organic semiconductor film.

The transfer characteristics in the saturated region of the TFT thus fabricated and operated are illustrated in FIG. 10A. In FIG. 10A, the horizontal axis represents gate voltage (V), the vertical axis on the left-hand side represents a square root of the absolute value of drain current, and the vertical axis on the right-hand side represents drain current (A) on a logarithmic scale. As can be seen from the gradient of the plot of FIG. 10A, the mobility in the saturated region is 6 cm$^2$/Vs. FIG. 10B illustrates the output characteristics of the fabricated devices described above. Cases involving gate voltages of $V_G$=0, −20, −30, and −40 are illustrated.

The organic semiconductor material employed in the method of the present embodiment can be the materials described in Embodiment 1. Also, the materials of the substrate 1 can be materials described in Embodiment 1.

B. Procedure for Manufacturing Organic Semiconductor Film Array

Figure 11A:
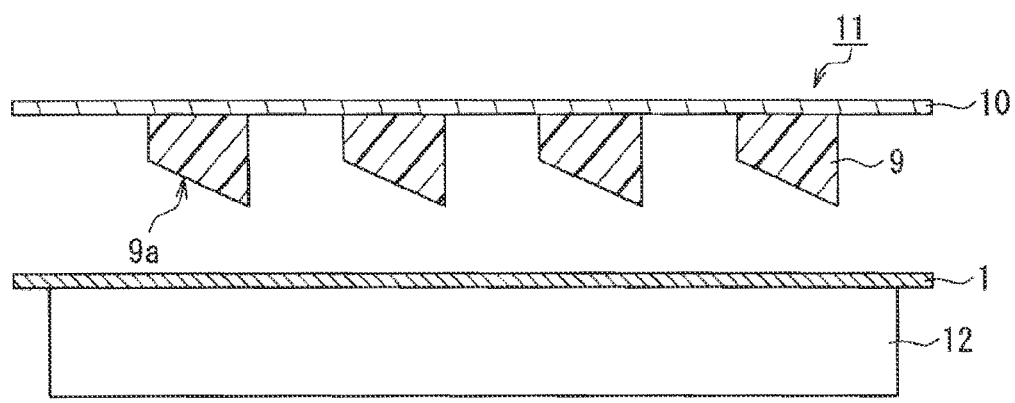
FIG. 11A is a cross-sectional view illustrating the steps of the method for manufacturing an organic semiconductor film array according to Embodiment 2.

A practical manufacturing method for an organic semiconductor film array based on the above-described basic procedure of the present embodiment will be described next with reference to FIGS. 11A-11D. As shown in FIG. 11A, this manufacturing method uses a contact member 11, in which multiple contact protrusions 9 performing functions similar to the planar contact member 8 illustrated in FIG. 8A are provided on an auxiliary substrate 10. The end face of each contact protrusion 9 constitutes a contact face 9a. In this example, the multiple contact faces 9a are inclined with respect to the surface of the auxiliary substrate 10. In addition, a hot plate 12 used for heating can be placed in contact with the rear surface of the substrate 1. This makes it easier to use materials poorly soluble in organic solvents at elevated temperatures.

Figure 11B:
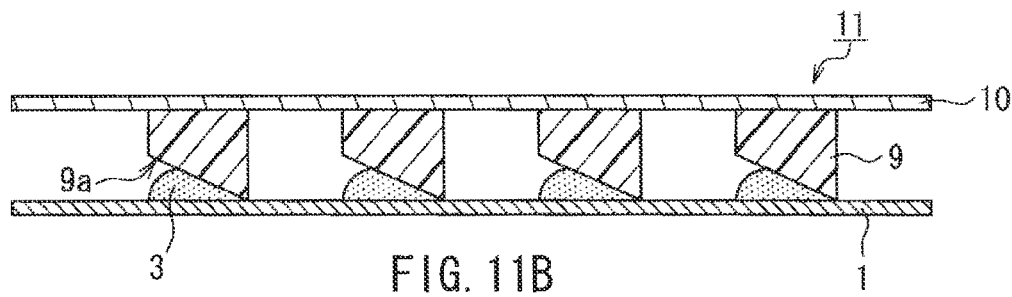
FIG. 11B is a cross-sectional view illustrating a step that is subsequent to FIG. 11A in the same manufacturing method.

As shown in FIG. 11A, the manufacturing procedure, in the same manner as in FIG. 8A, starts with placing the multiple contact faces 9a constituted by the end faces (bottom surfaces in the drawing) of the contact protrusions 9 opposite the substrate 1. Then, as shown in FIG. 11B, in order to establish a droplet-retaining state, the contact member 11 is arranged such that the distal ends of the contact protrusions 9 abut the surface of the substrate 1. In other words, as the edges of the contact faces 9a positioned farther away from the surface of the auxiliary substrate 10 abut the surface of the substrate 1, gaps are formed between the inclined portions of the contact faces 9a and the surface of the substrate 1. When a raw material solution is supplied in this state, droplets 3 of the raw material solution are retained between the surface of the substrate 1 and the multiple contact faces 9a. However, in the same manner as in Embodiment 1, the material solution for forming the droplets 3 can be supplied by other methods.

Figure 11C:
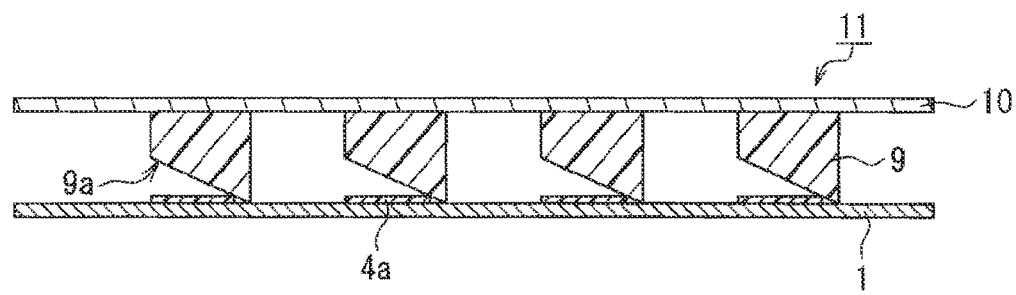
FIG. 11C is a cross-sectional view illustrating a step that is subsequent to FIG. 11B in the same manufacturing method.
Figure 11D:
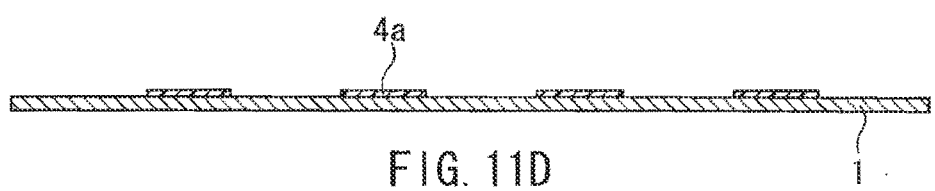
FIG. 11D is a cross-sectional view illustrating a step that is subsequent to FIG. 11C in the same manufacturing method.

When the solvent contained in the droplets 3 is evaporated by carrying out a drying process in this state, as shown in FIG. 11C, the crystallization of the organic semiconductor material contained in each droplet 3 proceeds as the evaporation of the solvent in a state proceeds, wherein the direction of crystal growth is kept under control. As a result, as shown in FIG. 11D, an organic semiconductor film 4a grows at the locations on the substrate 1 that correspond to the contact faces 9a of the multiple contact protrusions 9.

Figure 12:
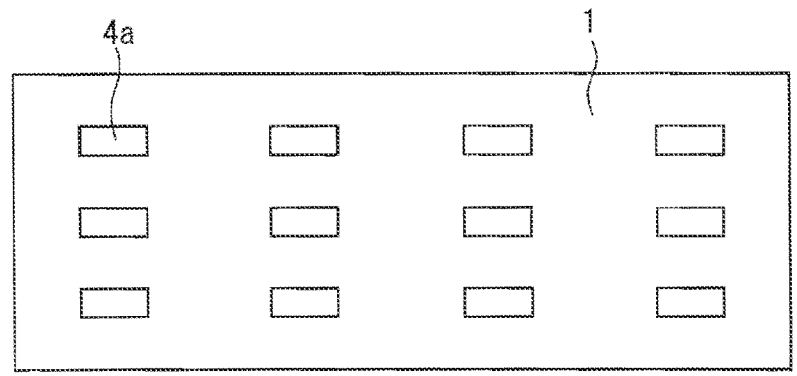
FIG. 12 is a plan view of an organic semiconductor film array fabricated by the same manufacturing method.

The planar shape of the organic semiconductor film array formed in this manner is shown in FIG. 12. It is possible to fabricate an array of organic semiconductor films 4a that are mutually separated in multiple regions on the surface of the substrate 1 and correspond to the contact faces 9a of the contact protrusions 9. The contact protrusions 9 used to form the array of organic semiconductor films 4a can be of different shapes and, in addition, their arrangement does not have to be regular and can be configured arbitrarily.

C. First Variation of Present Embodiment

Figure 13A:
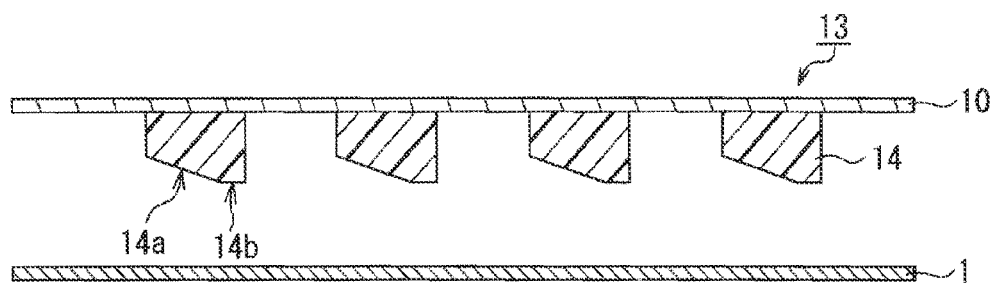
FIG. 13A is a cross-sectional view illustrating the steps of a first variation of the same manufacturing method.

A first variation of the manufacturing method of the present embodiment will now be described with reference to FIGS. 13A, 13B. In this variation, the contact member 13 illustrated in FIG. 13A is used instead of the contact member 11 illustrated in FIG. 11A. In the contact member 13 illustrated in the same drawing, multiple contact protrusions 14 have a contact face 14a constituted by an inclined portion inclined with respect to the surface of the auxiliary substrate 10, and, in addition, a portion thereof forms a flat abutment surface 14b that is parallel to the surface of the auxiliary substrate 10.

Figure 13B:
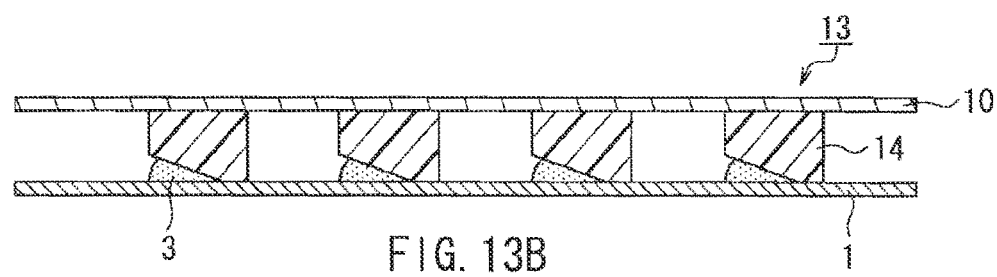
FIG. 13B is a cross-sectional view illustrating a step that is subsequent to FIG. 13A in the first variation of the same manufacturing method.

As shown in FIG. 13B, when a droplet-retaining state is established, the contact member 13 is placed on the substrate 1 such that the flat abutment surfaces 14b abut the surface of the substrate 1. As a result, gaps are formed between the contact faces 14a and the surface of the substrate 1. When a raw material solution is supplied in this state, droplets 3 are formed and can be retained by the contact faces 14a. In addition, placing the flat abutment surfaces 14b ire close contact with the surface of the substrate 1 produces the effect of minimizing the drying of the droplets 3 on the closed side of the contact faces 14a.

D. Second Variation of Present Embodiment

Figure 14A:
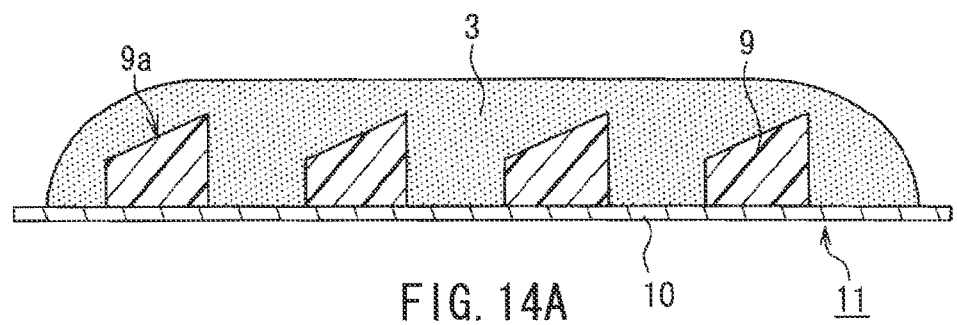
FIG. 14A is a cross-sectional view illustrating the steps of a second variation of the same manufacturing method.

A second variation of the manufacturing method of the present embodiment will now be described with reference to FIGS. 14A-14D. As shown in FIG. 14A, this variation uses the same contact member 11 as the one illustrated in FIG. 11A. However, the contact member 11 is arranged such that the contact faces 9a of the contact protrusions 9 face upward. Droplet 3 is formed by supplying a raw material solution onto the auxiliary substrate 10 in this state so as to cover the multiple contact faces 9a.

Figure 14B:
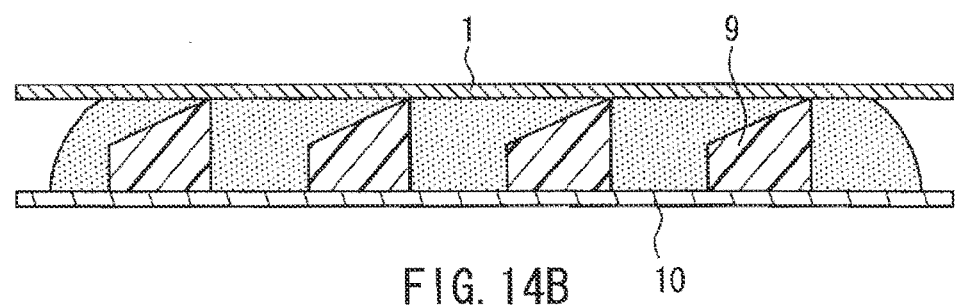
FIG. 14B is a cross-sectional view illustrating a step that is subsequent to FIG. 14A in the same manufacturing method.

Next, as shown in FIG. 14B, the substrate 1 is positioned above the contact member 11 and the distal ends of the contact protrusions 9 are caused to abut the surface of the substrate 1. Namely, the edges of the contact faces 9a positioned farther away from the surface of the auxiliary substrate 10 abut the surface of the substrate 1, and gaps are formed between the inclined portions of the contact faces 9a and the surface of the substrate 1. It should be noted that, in order to form the droplet 3, the raw material solution may be supplied subsequent to placing the substrate 1 in a face-to-face configuration.

Figure 14C:
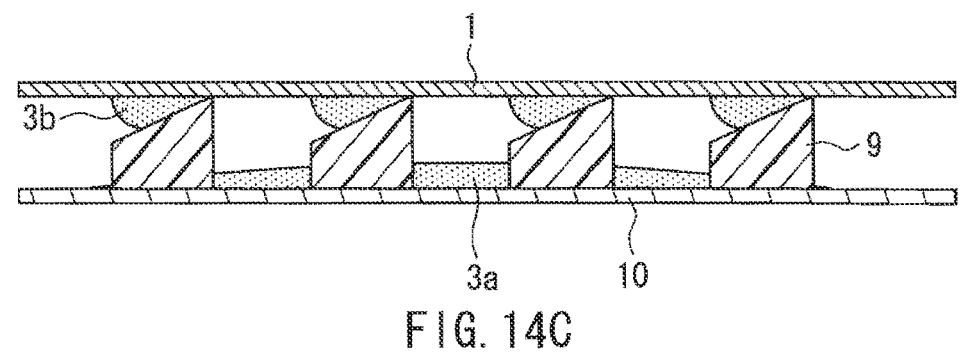
FIG. 14C is a cross-sectional view illustrating a step that is subsequent to FIG. 14B in the same manufacturing method.

As shown in FIG. 14C, when the solvent contained in the droplet 3 is evaporated by carrying out a drying process in this state, as the solvent evaporates, the droplet 3 is separated into a droplet 3a on the auxiliary substrate 10 and a droplet 3b on the substrate 1. The droplet 3b on the substrate 1 is further separated in correspondence to the multiple contact faces 9a and retained by the contact faces 9a on the substrate 1.

Figure 14D:
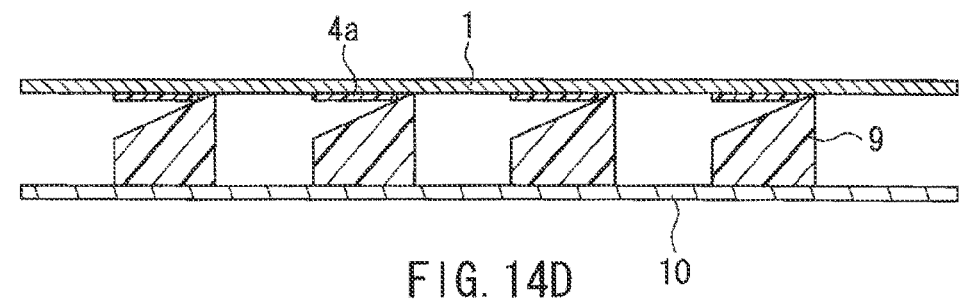
FIG. 14D is a cross-sectional view illustrating a step that is subsequent to FIG. 14C in the same manufacturing method.

The action produced as the drying process proceeds in this state is similar to the one in FIG. 11B described above, with the crystallization of the organic semiconductor material proceeding in a state in which the direction of crystal growth during the drying process is predefined. As a result, as shown in FIG. 14D, an organic semiconductor films 4a grow at the locations on the surface of the substrate 1 that correspond to the multiple contact faces 9a. During this process, the organic semiconductor films 4a is adhered to the $SiO_2$ substrate 1, whose adhesive properties are superior to those of the contact faces 9a of the contact protrusions 9.

E. Third Variation of Present Embodiment

A third variation of the manufacturing method of the present embodiment will now be described with reference to FIGS. 15A-15D. This variation is generally similar to the second variation and will be described by applying like reference numerals to like parts. As shown in FIG. 15B, the difference from the second variation is that the surface of the substrate 1 does not abut the distal ends of the contact protrusions 9 when the substrate 1 is arranged above the contact member 11. As a result, the clearance between the multiple contact faces 9a and the substrate 1 is increased in comparison with the state shown in FIG. 14B.

Figure 15A:
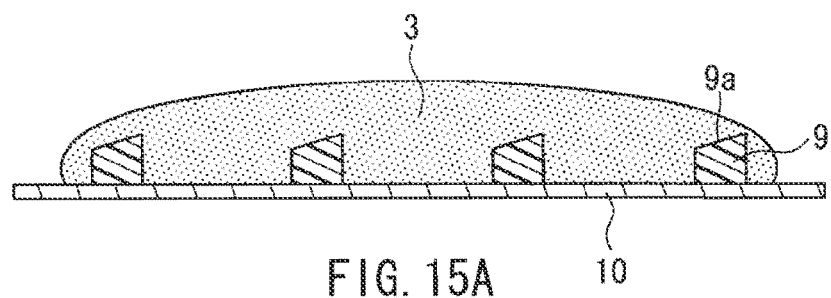
FIG. 15A is a cross-sectional view illustrating the steps of a third variation of the same manufacturing method.
Figure 15B:
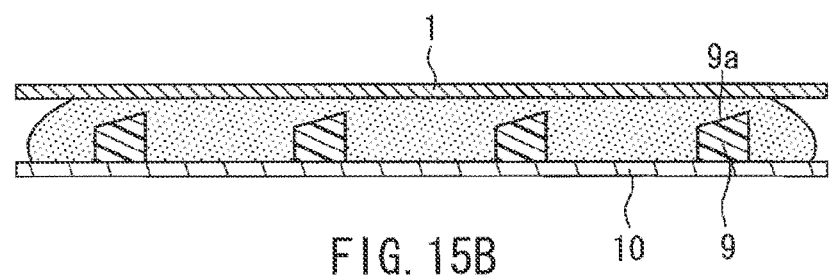
FIG. 15B is a cross-sectional view illustrating a step that is subsequent to FIG. 15A in the same manufacturing method.

In the same manner as in the second variation, the manufacturing procedure starts with forming droplet 3 by supplying a raw material solution onto the auxiliary substrate 10 in the state illustrated in FIG. 15A so as to cover the multiple contact faces 9a. Then, as shown in FIG. 15B, the substrate 1 is positioned above, without abutting the distal ends of the contact protrusions 9 and facing the multiple contact faces 9a with a certain clearance provided therebetween.

Figure 15C:
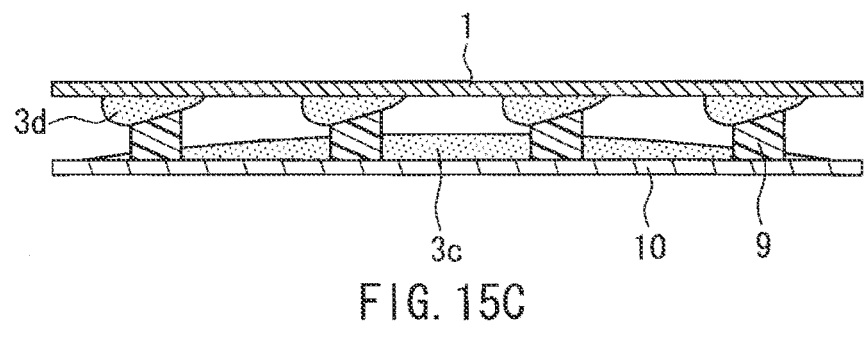
FIG. 15C is a cross-sectional view illustrating a step that is subsequent to FIG. 15B in the same manufacturing method.

When the solvent contained in the droplets 3 is evaporated by aiming out a drying process in this state, as the solvent evaporates, as shown in FIG. 15C, the droplets 3 is separated into droplet 3c on the auxiliary substrate 10 and droplet 3d on the substrate 1. The droplet 3d on the substrate 1 is further separated in correspondence to the multiple contact faces 9a and retained by the contact faces 9a on the substrate 1. In addition, unlike the case illustrated in FIG. 14C, since the substrate 1 does not abut the distal ends of the contact protrusions 9, the droplets 3d separated in correspondence to the contact faces 9a are formed with a larger length ratio relative to the length of the contact faces 9a in the direction of the substrate 1.

Figure 15D:
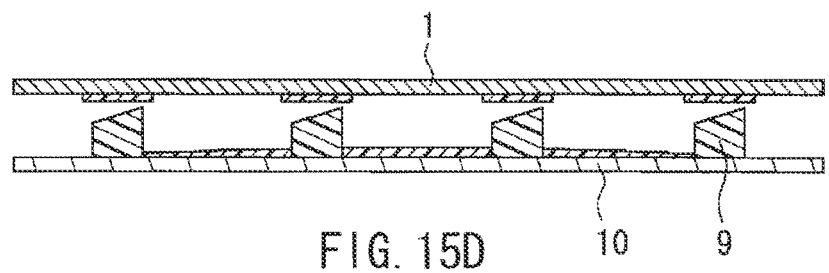
FIG. 15D is a cross-sectional view illustrating a step that is subsequent to FIG. 15C in the same manufacturing method.

The effect obtained as the drying process proceeds in this state is similar to the one in FIG. 11B described above, with the crystallization of the organic semiconductor material proceeding in a state, in which the direction of crystal growth during the drying process is predefined. As a result, as shown in FIG. 15D, an organic semiconductor films 4a grow at the locations on the surface of the substrate 1 that correspond to the multiple contact faces 9a.

F. Fourth Variation of Present Embodiment

Figure 16A:
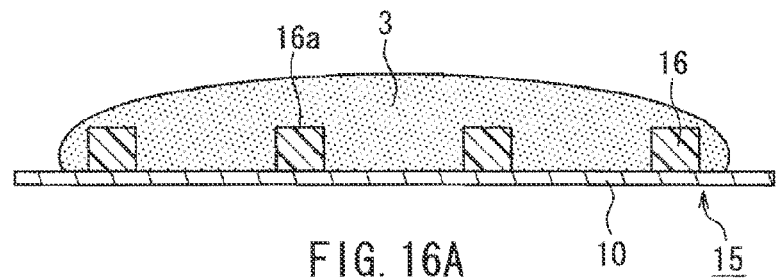
FIG. 16A is a cross-sectional view illustrating the steps of a fourth variation of the same manufacturing method.

A fourth variation of the manufacturing method of the present embodiment will now be described with reference to FIGS. 16A-16D. In this variation, the contact member 15 illustrated in FIG. 16A is used instead of the contact member 11 of the second variation illustrated in FIGS. 14A-14D. Namely, multiple contact protrusions 16 are provided on the surface of the auxiliary substrate 10 and contact faces 16a are constituted by the flat upper end faces of the contact protrusions 16 that are parallel to the surface of the auxiliary substrate 10.

Figure 16B:
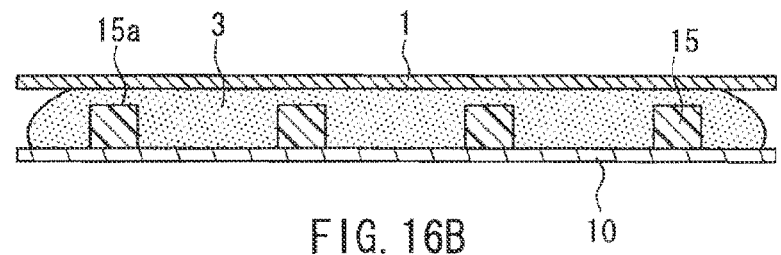
FIG. 16B is a cross-sectional view illustrating a step that is subsequent to FIG. 16A in the same manufacturing method.
Figure 16C:
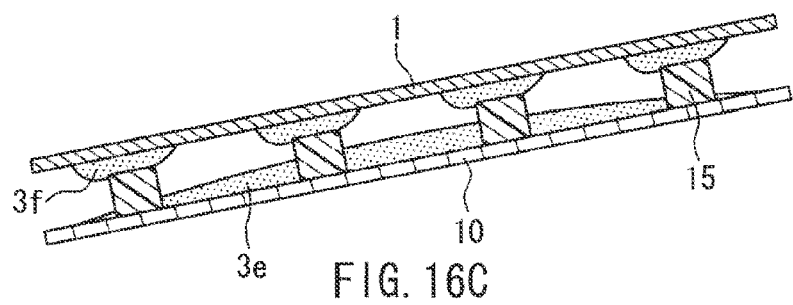
FIG. 16C is a cross-sectional view illustrating a step that is subsequent to FIG. 16B in the same manufacturing method.

As shown in FIG. 16A, the manufacturing procedure starts with forming droplet 3 by supplying a raw material solution onto the auxiliary substrate 10 so as to cover the contact faces 16a of the multiple contact protrusions 16. Then, as shown in FIG. 16B, the substrate 1 is positioned above so as to be opposed to the auxiliary substrate 10 with a clearance between it and the contact faces 16a of the multiple contact protrusions 16. As a result, a state is formed in which the space between the substrate 1 and the auxiliary substrate 10 is filled with the raw material solution. Furthermore, as shown in FIG. 16C, the auxiliary substrate 10 and the substrate 1 are kept inclined at a certain angle. However, it is not essential for the auxiliary substrate 10 and the substrate 1 to be inclined.

As shown in FIG. 16C, when the solvent contained in the droplet 3 is evaporated by carrying out a drying process in this state, as the solvent evaporates, the droplet 3 is separated into droplet 3e on the auxiliary substrate 10 and droplet 3f on the substrate 1. The droplet 3f on the substrate 1 is further separated in correspondence to the multiple contact protrusions 16 and retained on the substrate 1 by the contact faces 16a.

Figure 16D:
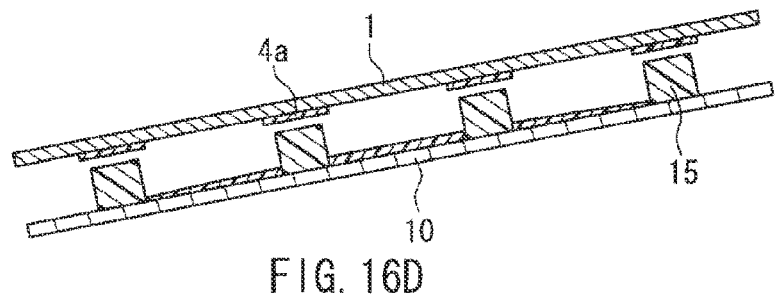
FIG. 16D is a cross-sectional view illustrating a step that is subsequent to FIG. 16C in the same manufacturing method.

As the drying process proceeds in this state, crystals of the organic semiconductor material grow in a state, in which the direction of crystal growth is predefined. As a result, as shown in FIG. 16D, an organic semiconductor film 4a is formed at the locations on the surface of the substrate 1 that correspond to the contact faces 16a of the multiple contact protrusions 16.

It is preferable that the organic semiconductor material used in the method of the present embodiment as described above possesses a high degree of self organizing function. By the term "self-aggregation capability" is meant the tendency of molecules to spontaneously aggregate and readily crystallize upon precipitation from a solvent. In addition to the materials described above, materials selected from dinaphth [2,3-b:2,3-f]thiopheno[3,2-b]thiophene derivatives, TIPS-pentacene, TES-ADT, and its derivatives, perylene derivatives, TCNQ, F4-TCNQ, rubrene, pentacene, and other low molecular weight semiconductor materials, as well as p3HT, pBTTT, pDA2T-C16 and the like can be used as the organic semiconductor materials.

INDUSTRIAL APPLICABILITY

The method for manufacturing an organic semiconductor film of the present invention is implemented using a simple procedure, permits fabrication of an organic semiconductor film of high charge mobility, and is useful in the fabrication, etc. of organic transistors.

DESCRIPTION OF THE REFERENCE SYMBOLS

1 Substrate
2 Edge contact member
2a, 6a, 8a, 9a, 14a, 16a Contact face
3, 3a, 3b, 3c, 3d, 3e, 3f Droplet
4, 4a Organic semiconductor film
5, 10 Auxiliary substrate
6, 9, 14, 16 Contact protrusion
7, 11, 13, 15 Contact member
8 Planar contact member
12 Hot plate
14b Flat abutment surface

The invention claimed is:
1. A method for manufacturing an organic semiconductor film for forming a channel of an organic thin film transistor by supplying a raw material solution containing an organic semiconductor material and a solvent onto a substrate and drying the raw material solution, thereby forming an organic semiconductor film on the substrate, the method comprising:
    positioning a contact member having a plurality of contact faces for contacting the raw material solution, such that the contact faces have a certain relationship with a surface of the substrate, and forming a plurality of droplets of the raw material solution on the substrate, thereby establishing a droplet-retaining state, in which each one of the contact faces retains one of the respective droplets through contact between the contact face and the respective droplet;
    evaporating the solvent in the droplets, so as to form the organic semiconductor films at locations on the surface of the substrate that correspond to the plurality of contact faces, and
    removing the contact member from the surface of the substrate, after the solvent in the droplets of the raw material solution is evaporated and films containing the organic semiconductor material are formed,
    wherein the contact member comprises an auxiliary substrate and a plurality of contact protrusions formed on the auxiliary substrate, and each of the contact faces is configured with a portion of faces of the contact protrusions that intersect a surface of the auxiliary substrate; and
    when the droplet-retaining state is established, the contact member is arranged such that the contact protrusions contact the surface of the substrate from above, and an edge portion of each one of the droplets is in contact with only one of the contact faces.

2. The method for manufacturing an organic semiconductor film according to claim 1, wherein the substrate is kept inclined at a certain angle, and the contact member is placed on the substrate such that the faces configuring the contact faces cross a tilting direction of the substrate.

3. A method for manufacturing an organic semiconductor film for forming a channel of an organic thin film transistor by supplying a raw material solution containing an organic semiconductor material and a solvent onto a substrate and drying the raw material solution, thereby forming an organic semiconductor film on the substrate, the method comprising:

positioning a contact member having a plurality of contact faces for contacting the raw material solution such that the contact faces have a certain relationship with a surface of the substrate, and forming a plurality of droplets of the raw material solution on the substrate, thereby establishing a droplet-retaining state, in which each of the contact faces retains one of the respective droplets through contact between the contact face and the respective droplet;

evaporating the solvent in the droplets, so as to form the organic semiconductor films at the locations on the surface of the substrate that correspond to the plurality of contact faces, and removing the contact member from the surface of the substrate, after the solvent in the droplets of the raw material solution is evaporated and films containing the organic semiconductor material are formed, wherein the contact member comprises an auxiliary substrate and a plurality of contact protrusions formed on the auxiliary substrate, and faces of the contact protrusions configure the contact faces, and when the droplet-retaining state is established, the contact member is arranged such that the contact faces formed of the plurality of the contact protrusions face the surface of the substrate with at least a partial gap provided therebetween, and an edge portion of each one of the droplets is in contact with only one of the contact faces within the gap formed between the surface of the substrate and the respective contact face.

4. The method for manufacturing an organic semiconductor film according to claim 3, wherein each of the plurality of contact faces has an inclined portion that is inclined relative to the surface of the auxiliary substrate.

5. The method for manufacturing an organic semiconductor film according to claim 4, wherein, when the droplet-retaining state is established, the contact member is arranged such that a portion of the contact faces contacts the surface of the substrate.

6. The method for manufacturing an organic semiconductor film according to claim 3, wherein, after supplying the raw material solution in order to form the droplets, the droplet-retaining state is established by keeping the auxiliary substrate and the substrate inclined at a predetermined angle.

7. The method for manufacturing an organic semiconductor film according claim 1, wherein the organic semiconductor material is formed of a material selected from the group consisting of [1]benzothieno[3,2-b]benzothiophene derivatives, 2,9-dialkyldinaphtho[2,3-b:2',3'-f]thieno[3,2-b]thiophene derivatives, dinaphth[2,3-b:2,3-f]thiopheno[3,2-b]thiophene derivatives, TIPS-pentacene, TES-ADT, and its derivatives, perylene derivatives, TCNQ, F4-TCNQ, rubrene, pentacene, p3HT, pBTTT, and pDA2T-C16.

* * * * *